United States Patent [19]
Linliu

[11] Patent Number: 6,133,085
[45] Date of Patent: Oct. 17, 2000

[54] METHOD FOR MAKING A DRAM CAPACITOR USING A ROTATED PHOTOLITHOGRAPHY MASK

[75] Inventor: Kung Linliu, Hsinchu, Taiwan

[73] Assignee: Taiwan Semiconductor Manufacturing Corporation, Hsinchu, Taiwan

[21] Appl. No.: 09/346,324

[22] Filed: Jul. 2, 1999

[51] Int. Cl.$^7$ .............................................. H01L 21/8242
[52] U.S. Cl. .................... 438/239; 438/253; 438/254; 438/258; 438/238
[58] Field of Search .................. 438/239, 253, 438/254, 255, 256

[56] References Cited

U.S. PATENT DOCUMENTS 5,821,142  10/1998  Sung et al. ............................. 438/253
6,020,234   2/2000  Li et al. ................................. 438/254
6,037,234   3/2000  Hong et al. ............................ 438/253

*Primary Examiner*—Trung Dang
*Attorney, Agent, or Firm*—Blakely, Sokoloff, Taylor & Zafman LLP

[57] ABSTRACT

A method of forming a bottom storage node of a DRAM capacitor over a contact plug is disclosed. The method comprises the steps of: depositing an oxide layer over the contact plug; etching the oxide layer using a first photoresist layer having with a first masking pattern, the first masking pattern allowing the removal of the oxide layer over the contact plug; depositing a polysilicon layer over the oxide layer and in electrical contact with the contact plug; forming a second photoresist layer having a second masking pattern onto the polysilicon layer, the second masking pattern being substantially similar to the first masking pattern, but rotated by a predetermined angle; and etching the polysilicon layer in accordance with the second photoresist layer until the oxide layer is reached.

9 Claims, 4 Drawing Sheets

METHOD FOR MAKING A DRAM CAPACITOR USING A ROTATED PHOTOLITHOGRAPHY MASK

TECHNICAL FIELD OF THE INVENTION

This invention relates to semiconductor memories, and more particularly, to an improved method for making a high density DRAM capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its footprint. Recently, capacitors having a three-dimensional structure have been suggested to increase cell capacitance. Such capacitors include, for example, double-stacked, fin-structured, cylindrical, spread-stacked, and box structured capacitors.

There is also a challenge to develop methods of manufacturing these capacitors that minimize the manufacturing costs and provide maximum process tolerance to maximize product yields. The present invention is directed to such an improved capacitor.

SUMMARY OF THE INVENTION

A method of forming a bottom storage node of a DRAM capacitor over a contact plug is disclosed. The method comprises the steps of: depositing an oxide layer over said contact plug; etching said oxide layer using a first photoresist layer having with a first masking pattern, said first masking pattern allowing the removal of said oxide layer over said contact plug; depositing a polysilicon layer over said oxide layer and in electrical contact with said contact plug; forming a second photoresist layer having a second masking pattern onto said polysilicon layer, said second masking pattern being substantially similar to said first masking pattern, but rotated by a predetermined angle; and etching said polysilicon layer in accordance with said second photoresist layer until said oxide layer is reached.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method of forming a DRAM having a bi-continuous box shaped capacitor which has high capacitance, and is simple to manufacture.

Figure 1:
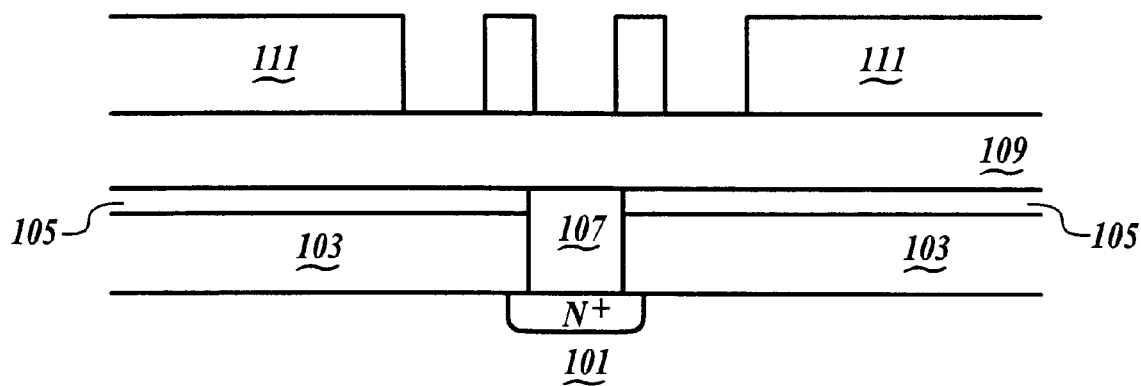
FIGS. 1 and 2 are cross-sectional views of a semiconductor substrate illustrating the steps of the present invention for forming a DRAM capacitor.

Turning to FIG. 1, a semiconductor substrate 101 is shown. The substrate is understood to possibly include a semiconductor wafer, active and passive devices formed within the wafer, and layers formed on the wafer's surface. The term "substrate" is meant to include devices formed within a semiconductor wafer and the layers overlying the wafer. The term "substrate surface" is meant to include the uppermost exposed layers on a semiconductor wafer, such as a silicon surface, an insulating layer, and metal lines.

In FIG. 1, an insulating layer 103 is formed atop the substrate 101. Next, a barrier layer 105 is formed atop the insulating layer 103. Preferably, the barrier layer 105 is composed of silicon nitride. Next, a contact opening is made using conventional masking and etching techniques into the barrier layer 105 and insulating layer 103 down to the substrate 101. The opening is then filled with a conductive material forming a plug 107. Such a conductive material includes, for example, insitu doped polysilicon, tungsten, or aluminum. In the preferred embodiment, the plug is filled with tungsten. Typically, the plug 107 is formed by depositing a layer of tungsten over the entire barrier layer 105 and into the opening. Next, either a chemical mechanical polishing process or a reactive ion etching process may be used to remove that portion of the tungsten layer that remains above the barrier layer 105.

Figure 1A:
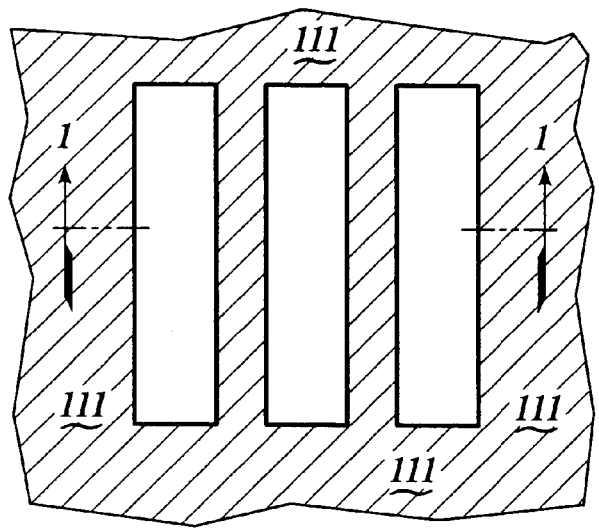
FIGS. 1A and 2A are top views of FIGS. 1 and 2.

Next, a second insulating layer 109 is deposited over the barrier layer 105 and the tungsten plug 107. Preferably, the second insulating layer 109 is comprised of an oxide. Further, a photoresist layer 111 is patterned and developed onto the oxide layer 109. The photoresist layer 111 has a "triple bar" pattern that is shown in top view in FIG. 1A. As will be seen in greater detail below, although three bars are provided by the photoresist layer 111, the present invention may be practiced with an number of bars.

Figure 2:
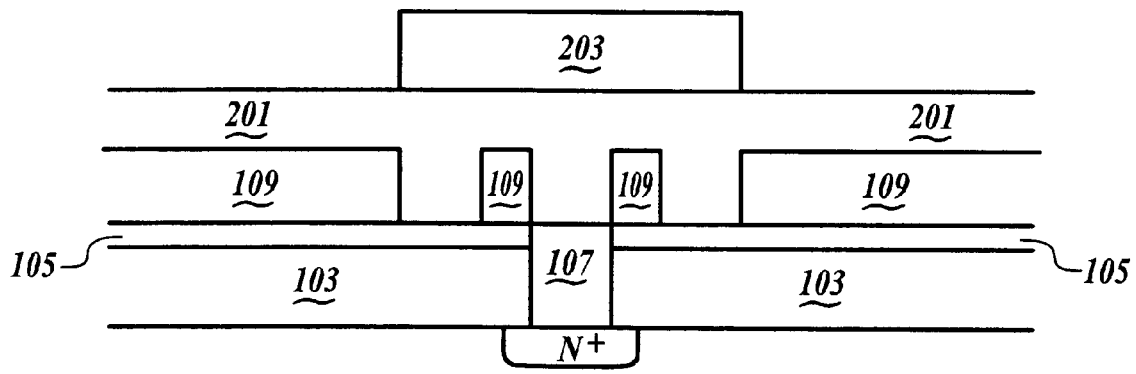

Next, turning to FIG. 2, the oxide layer 109 is etched using the photoresist layer 111 as a mask. The etching is stopped when the barrier layer 105 is reached. Preferably, the barrier layer 105 is a silicon nitride layer, which is a good etching stop for an oxide etch. The resulting structure is seen in cross section in FIG. 2. Additionally, after the etching, a first polysilicon layer 201 is deposited over the etched oxide layer 109. Preferably, the first polysilicon layer 201 is an insitu doped polysilicon layer. The in-situ doped polysilicon layer may be deposited using any conventional technique. For example, a CVD process using phosphine ($PH_3$) and silane ($SiH_4$) as the reactant gases may be used. Preferably, the in-situ doped polysilicon layer has a thickness of between 500 and 3000 angstroms. A deposition temperature of the in-situ doped polysilicon is preferably between 500° and 540° C.

The first polysilicon layer 201 fills the openings in the oxide layer 109. Note that the photoresist layer 111 is patterned such that the oxide layer 109 above the tungsten plug 107 is removed. This allows electrical contact between the tungsten plug 107 and the first polysilicon layer 201.

Figure 2A:
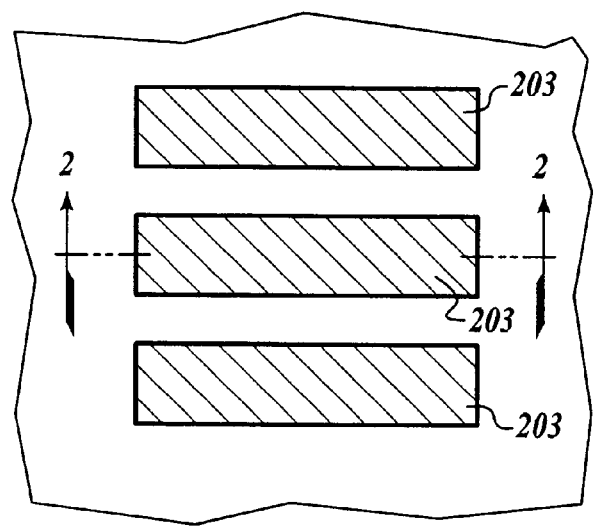
Figure 3:
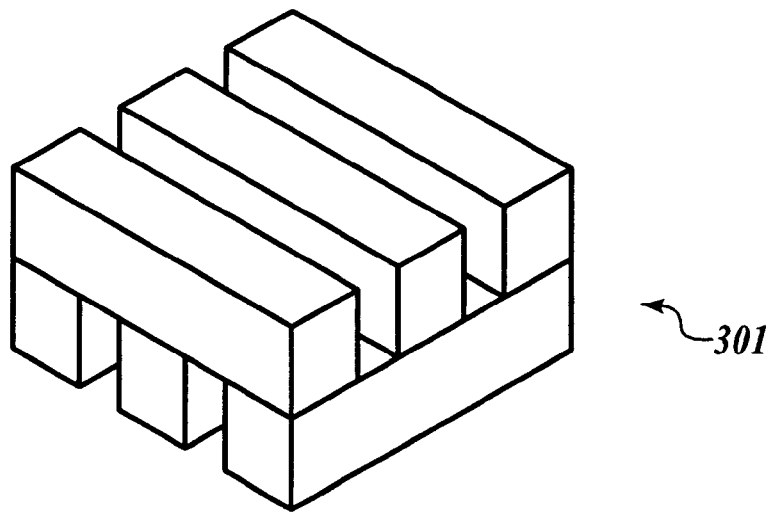
FIG. 3 is an isometric view of a bi-continuous polysilicon structure formed in FIGS. 1 and 2.

Still referring to FIG. 2, a second photoresist layer 203 is patterned and developed onto the first polysilicon layer 201. Although not readily apparent in FIG. 2, the second photoresist layer 203 has a pattern that is orthogonal to that used in the first photoresist layer 111. Thus, one advantage of the present invention is that a single masking pattern may be used. For example, the reticle used to form the first photoresist layer 111 may simply be rotated ninety-degrees and then reused for the second photoresist layer 203. FIG. 2A shows the top view of the second photoresist layer 203.

Note that a subsequent etching using the second photoresist layer 203 etches the first polysilicon layer 201. Therefore, if the first photoresist layer 111 is a positive photoresist, if the same rotated reticle is to be used, then the second photoresist layer 203 should be a negative photoresist. Once the second photoresist layer 203 is developed, an etching of the first polysilicon layer 201 is personnel. The result of the etching is that all of the first polysilicon layer 201 that is outside of the "three bars" of the second photoresist layer 203 is removed down to the oxide layer 109. Adequate care should be taken to ensure that while the oxide layer 109 is reached, overetching should not be too severe. Otherwise, portions of the polysilicon layer 201 that are embedded within the oxide layer 109 will be undesirably removed. Control of polysilicon etching is well known in the art and it is a simple matter to have the desired depth control.

After the first polysilicon layer 201 is etched, the photoresist layer 203 is stripped. Furthermore, the remaining portions of the oxide layer 109 are removed, preferably by a wet dip in a dilute HF solution using the barrier layer (silicon nitride) 105 as the stop layer.

The result is a box like structure 301 that have bars of polysilicon that are orthogonal to each other on different layers. Note that the structure has an extremely high amount of surface area for the footprint that it requires on the substrate surface.

Next, conventional techniques are used to form a dielectric layer over the structure 301 that forms a bottom electrode of a DRAM capacitor. The dielectric layer is preferably a composite layer of oxide/nitride/oxide (ONO). Finally, to complete the formation of the capacitor, a top electrode of the capacitor is formed over the dielectric layer. Preferably, the top electrode is a layer of insitu doped polysilicon. Moreover, the capacitor of the present invention is commonly used in DRAM cells as the capacitor over bitline (COB). Thus, the tungsten plug 107 is connected to an underlying MOSFET formed in the semiconductor substrate 101.

In addition, while FIGS. 1 and 2 illustrate a double stack of polysilicon bars, the procedure can be repeated an arbitrary number of times to increase the number of stacks of polysilicon bars. Moreover, as noted above, the preferred embodiment shows three bars, but any number of polysilicon bars may be used.

Figure 4:
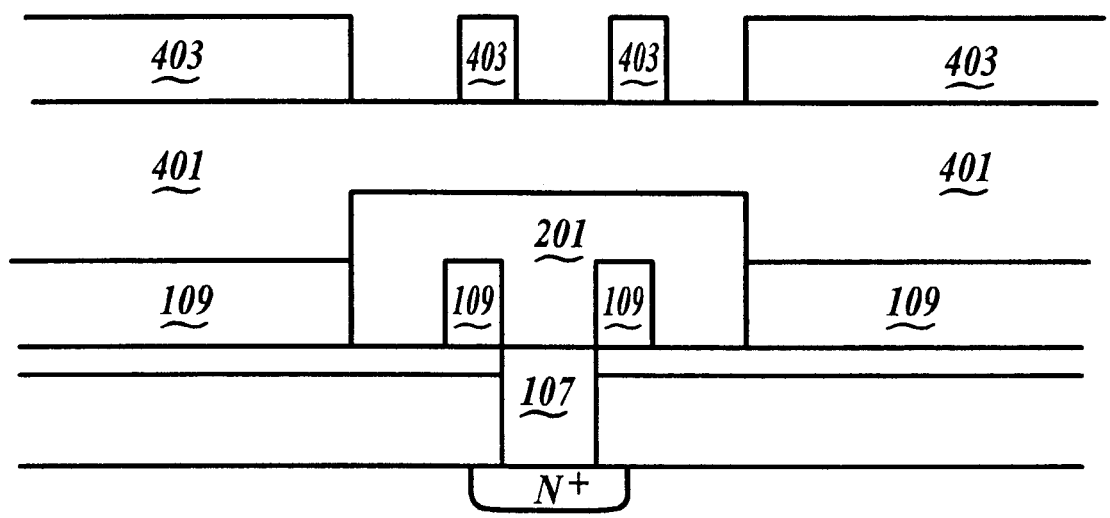
FIGS. 4 and 5 are cross-sectional views of a semiconductor substrate illustrating the formation of additional polysilicon stacks in accordance with the present invention.

To see how the technique of the present invention can be extended to multiple stacks, reference is made to FIG. 4. In FIG. 4, after the polysilicon layer 201 has been etched and the second photoresist layer 209 has been stripped, a second oxide layer 401 is deposited over the top of the polysilicon layer 201 and first oxide layer 109. Next, a third photoresist layer 403 is patterned and developed over the second oxide layer 401. The third photoresist layer 403 is patterned using the same reticle mask as the first photoresist layer 111 of FIG. 1.

The second oxide layer 401 is then etched and the etching is stopped when the first polysilicon layer 201 is reached. The resulting structure is seen in cross section in FIG. 5. After the etching, a second polysilicon layer 501 is deposited over the etched oxide layer 401. Preferably, the second polysilicon layer 501 is an insitu doped polysilicon layer formed like the first polysilicon layer 201. The second polysilicon layer 501 fills the openings in the second oxide layer 401.

Figure 5:
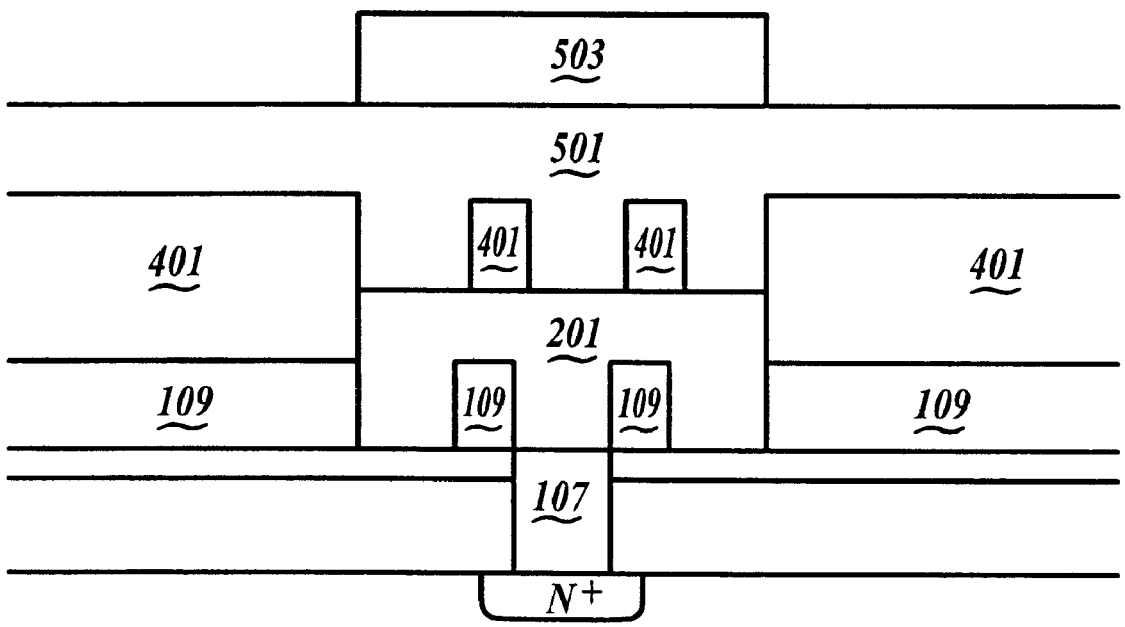

Still referring to FIG. 5, a fourth photoresist layer 503 is patterned and developed onto the second polysilicon layer 501. Although not readily apparent in FIG. 5, the fourth photoresist layer 503 has a pattern that is orthogonal to that used in the third photoresist layer 403 and is the same as the second photoresist layer 203.

Note that the fourth photoresist layer 503 etches the second polysilicon layer 501. Therefore, if the third photoresist layer 403 is a positive photoresist, if the same rotated reticle is to be used, then the fourth photoresist layer 503 should be a negative photoresist. Once the fourth photoresist layer 503 is developed, an etching of the second polysilicon layer 501 is performed.

The result of the etching is that all of the second polysilicon layer 501 that is outside of the "three bars" of the fourth photoresist layer 503 is removed down to the second oxide layer 401. After the second polysilicon layer 501 is etched, the photoresist layer 503 is stripped. This process may be repeated as many times as desired to increase the surface area of the bottom storage node of a DRAM capacitor.

While the preferred embodiment of the invention has been illustrated and described, it will be appreciated that various changes can be made therein without departing from the spirit and scope of the invention. For example, although in the preferred embodiment, the masking patterns are in orthogonal relation to each other, it can be appreciated that the masking patterns may be offset from each other by an arbitrary angle.

The embodiments of the invention in which an exclusive property or privilege is claimed are defined as follows:

1. A method of forming a bottom storage node of a DRAM capacitor over a contact plug, the method comprising the steps of:

depositing an oxide layer over said contact plug;

etching said oxide layer using a first photoresist layer having with a first masking pattern, said first masking pattern allowing the removal of said oxide layer over said contact plug;

depositing a polysilicon layer over said oxide layer and in electrical contact with said contact plug;

forming a second photoresist layer having a second masking pattern onto said polysilicon layer, said second masking pattern being substantially similar to said first masking pattern, but rotated by a predetermined angle; and etching said polysilicon layer in accordance with said second photoresist layer until said oxide layer is reached.

2. The method of claim 1 further including the step of depositing a silicon nitride layer underneath said oxide layer, said silicon nitride layer acting as an etching stop during the etching of said oxide layer.

3. The method of claim 1 wherein said second masking pattern is substantially orthogonal to said first masking pattern.

4. The method of claim 1 wherein the etching in accordance with said first photoresist layer results in a plurality of rectangular openings formed in said oxide layer that are parallel to each other, at least one of said rectangular openings being atop of said contact plug.

5. The method of claim 4 wherein said second masking pattern is substantially orthogonal to said first masking pattern.

6. The method of claim 4 wherein there are three of said rectangular openings.

7. The method of claim 1 wherein said first photoresist is a positive photoresist and said second photoresist is a negative photoresist.

8. The method of claim 1 wherein said first photoresist is a negative photoresist and said second photoresist is a positive photoresist.

9. The method of claim 8 wherein said step of forming said HSG polysilicon is performed at a temperature of 560° to 660° C.

* * * * *